United States Patent [19]

Rezek

[11] 3,784,923

[45] Jan. 8, 1974

[54] CONTROLLABLE AUDIO AMPLIFIER FOR MINIATURE RECEIVER PROVIDED BY A THICK FILM MODULE INCLUDING AN INTEGRATED CIRCUIT

[75] Inventor: John R. Rezek, Coral Springs, Fla.

[73] Assignee: Motorola, Inc., Franklin Park, Ill.

[22] Filed: June 9, 1971

[21] Appl. No.: 151,461

[52] U.S. Cl. ....................... 330/22, 330/16, 330/17, 330/20, 330/38 M

[51] Int. Cl. ............................................ H03f 3/04

[58] Field of Search ............ 330/38 M, 30 D, 22 C; 325/485, 485 Z

[56] References Cited

UNITED STATES PATENTS

| | | | |
|---|---|---|---|
| R27,454 | 8/1972 | Harwood | 330/38 M X |
| 3,581,226 | 5/1971 | Perkins et al. | 330/30 D |
| 3,649,846 | 3/1972 | Frederiksen | 330/38 M X |
| 3,678,405 | 7/1972 | Avius | 330/30 D X |
| 3,694,762 | 9/1972 | Mulder | 330/38 M X |
| 3,697,883 | 10/1972 | Wilcox | 330/30 D X |
| 3,497,821 | 2/1970 | Rongen et al. | 330/38 M X |
| 3,622,900 | 11/1971 | Hanus et al. | 330/38 M X |

*Primary Examiner*—Nathan Kaufman
*Attorney*—Mueller, Aichele & Gillman

[57] ABSTRACT

Controllable audio amplifier for miniature radio receiver, such as paging receiver, provided as a hybrid module which includes a monolithic circuit chip on a circuit providing base. A pre-amplifier on the thick film applies signals to a differential power amplifier on the integrated circuit. The differential amplifier has two balanced sides, each having a plurality of stages and a direct current feedback loop with a voltage reference for providing bias stability for the class B output stages. A voltage regulator on the thick film is controlled by transistors on the integrated circuit to provide operating voltage to the amplifier only when the proper control signal is received. A control circuit turns on the regulator in response to various control signals, and includes a latching circuit for holding the amplifier on subject to reset by multiple means. This can be responsive to a voltage from a decoder or a receiver squelch circuit. Manual on and off operation is also provided.

14 Claims, 3 Drawing Figures

INVENTOR
JOHN R. REZEK
BY
Mueller & Aichele
ATTYS.

INVENTOR
JOHN R. REZEK
BY Mueller & Aichele
ATTYS.

CONTROLLABLE AUDIO AMPLIFIER FOR MINIATURE RECEIVER PROVIDED BY A THICK FILM MODULE INCLUDING AN INTEGRATED CIRCUIT

BACKGROUND OF THE INVENTION

For use in battery operated radio pagers, such as a miniature radio or radio pager, it is desired to provide an audio amplifier which operates from a low voltage and is highly efficient so that adeuqate audio power is provided from a small battery. For example, it may be desirable to use a single alkaline cell which provides a voltage of the order of 1.0 to 1.5 volts. This low voltage requires the circuit design to be such that two or more transistor junctions are not series connected. This is true for silicon semiconductor material which is commonly used in integrated circuits provided in miniature electronic equipment.

It is further desired that miniature paging receivers be continually operative so that they can receive a page or other radio signal at any time, and a suitable audio amplifier operating continuously will consume substantial power, even if it draws small standby current. Although audio amplifiers have been used which are substantially turned off when not in use and respond to a signal to render the amplifier operative, such amplifiers which are known are not entirely satisfactory for miniature paging receivers.

Miniature receivers used for paging purposes should preferably be of a size to be carried in a pocket, similar to a pen or pencil. To provide a receiver of such small size it is necessary that all components thereof be as small and compact as possible. Although integrated circuit audio amplifiers have been provided, the amplifiers which are known do not provide the modes of operation required, and switching circuits to provide such operation require additional components that take up a substantial amount of space. Further the amplifiers which have been available have not had the required efficiency to provide the output desired when operating at low battery voltages.

SUMMARY OF THE INVENTION

It is an object of the present invention to provide an improved highly stable audio amplifier for operation at low battery voltages; of the order of 1 volt.

Another object of the invention is to provide an audio amplifier suitable for construction in integrated circuit form which operates from a low battery voltage and has high efficiency to provide adequate audio power output.

A further object of the invention is to provide an audio amplifier and control circuit for selectively rendering the same operation, which can be provided on a single integrated circuit chip with a minimum of external components.

A still further object is to provide an audio amplifier for a miniature receiver wherein components provided on an integrated circuit ship are conbined with other components on a substrate, such as a thick film, to form a compact hybrid structure.

In accordance with the invention, an audio amplifier is provided for operating at a battery voltage of the order of 1 to 1 ½ volts, which includes a pre-amplifier and an integrated circuit output amplifier. The integrated circuit amplifier is of the differential type with emitter coupled input transistors, each feeding a two stage amplifier having a direct current feedback loop to provide bias stability. A high impedance current source is coupled to the emitter electrodes of the input transistors. The differential amplifier is energized by a voltage regulator which is actuated by a control circuit. The voltage regulator is normally clamped off and is turned on in response to a control signal and may then be latched on for a sufficient time to permit amplification of an audio message. The latching circuit can be automatically reset at the end of the audio message. The control circuit can also be manually controlled. The control portion of the voltage regulator and latching control circuits are provided on the same integrated circuit chip with the audio amplifier. The integrated circuit chip can be a part of a hybrid module which includes the pre-amplifier, the series regulating transistor of the voltage regulator and various capacitors.

DETAILED DESCRIPTION

Figures 1, 2:
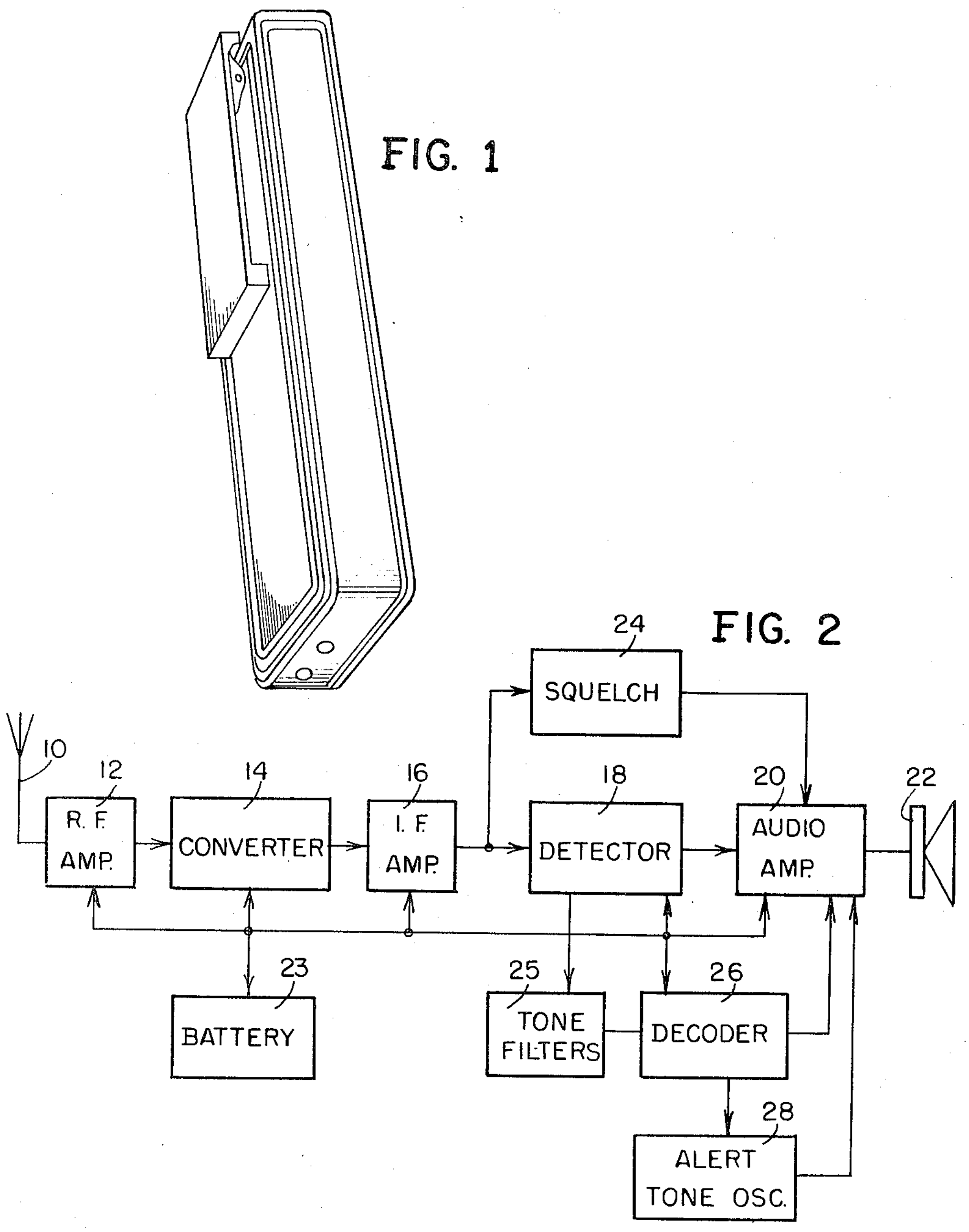
FIG. 1 is a perspective view of a paging receiver of the type in which the amplifier of the invention may be used.
FIG. 2 is a block diagram of the receiver of FIG. 1.

FIG. 1 shows a miniature frequency modulation (FM) radio receiver, such as that used for paging purposes, which may utilize the amplifier of the invention. This receiver is of a size and configuration to be carried in a shirt pocket of the user, and may have a length of about 4 ¼ inches, a width of about 1 ⅛ inches and a thickness of about ¾ of an inch. These dimensions are only representative and the amplifier of the invention can be used in receivers of other dimensions. The receiver includes a self-contained battery and a sound transducing device. The battery can be much smaller than batteries normally used in such equipment due to the low voltage operation of the receiver.

FIG. 2 shows a block diagram of a representative receiver in which the amplifier may be used. This includes an antenna 10 which applies signals to a radio frequency amplifier 12. Signals from the radio frequency amplifier are reduced in frequency by converter 14, which may have one or more stages of frequency conversion. The reduced frequency signals are applied to intermediate amplifier 16, which includes limiter stages for removing amplitude modulation. The output of the intermediate frequency amplifier is applied to detector 18 which derives the modulation signal from the intermediate frequency signal, and the modulation signal is then applied to audio amplifier 20 which increases the level of the audio signal. The amplified audio signal is applied to sound reproducing device 22, which may be a center tapped loudspeaker of known type. Electrical enerby is supplied to the receiver by battery 23, which may be a single cell providing a voltage in the range from 1.0 to 1.5 volts.

The receiver includes a squelch circuit 24 which operates from the intermediate frequency signal and/or the output of detector 18, and which can be used to control the audio amplifier 20. The paging receiver also receives a code signal for selecting a particular receiver, which may include tone signals of particular frequencies or other coded signals. These code signals are derived by the detector 18 and selected by tone filters 25 and applied to the decoder 26. The decoder acts to produce a control signal which is applied to the audio amplifier 20 and which is also applied to an alert tone oscillator 28. Accordingly, when the proper code is received, the alert tone oscillator is operated and the audio amplifier is rendered operative to amplify the alert tone signal and apply the same to the loudspeaker 22. The audio amplifier 20 may remain operative to amplify voice signals and be reset by the squelch signal at the end of a voice transmission.

Figure 3:
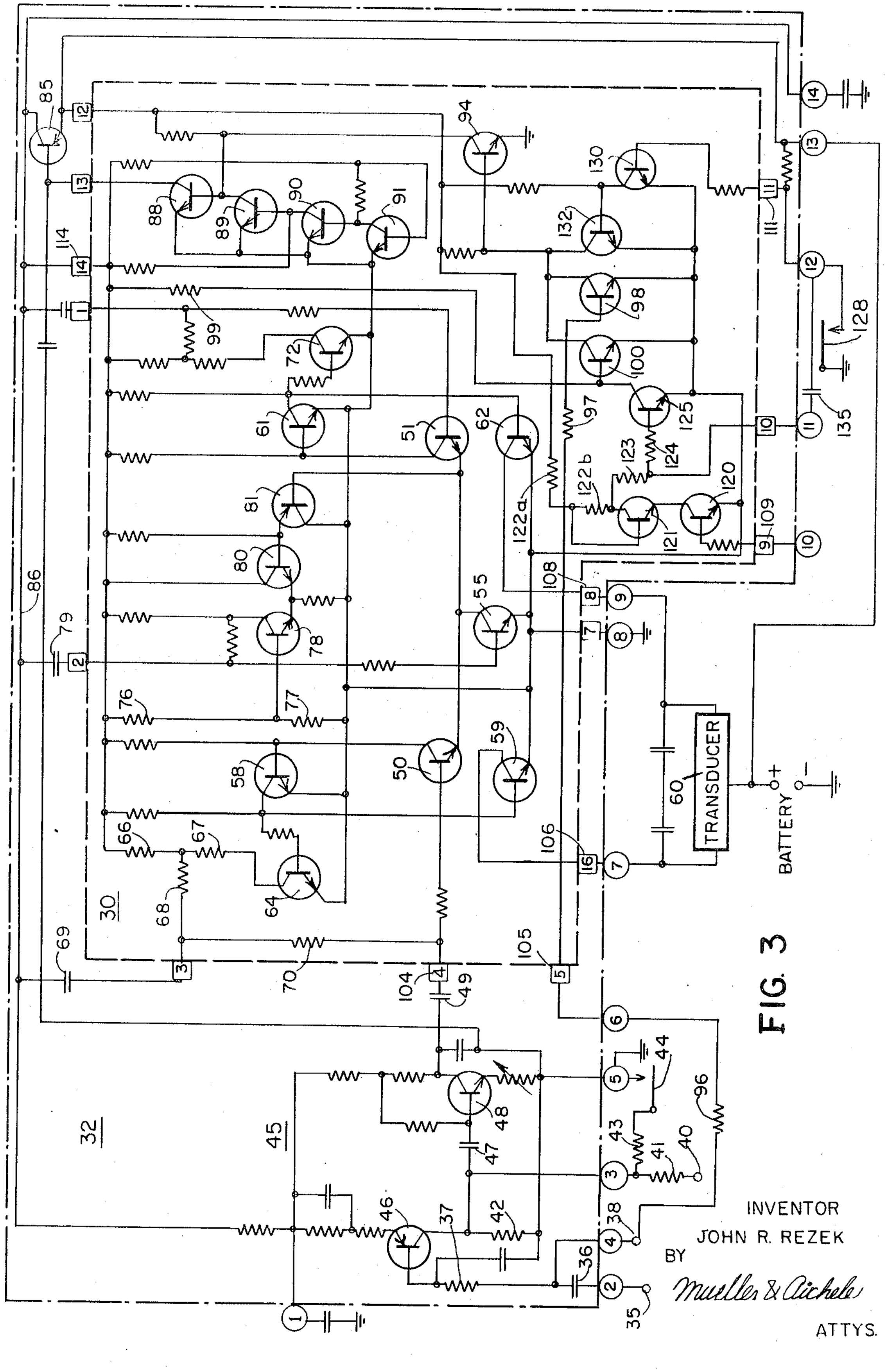
FIG. 3 is a schematic diagram of the audio amplifier of the invention.

The invention of the present application is directed to an audio amplifier and control circuit which can be used as the audio amplifier 20 of the block diagram of FIG. 2. This is illustrated in the schematic diagram of FIG. 3. This audio amplifier is of general application. The audio amplifier is constructed as a hybrid module which includes an integrated circuit 30, which is shown within the dashed lines in the central portion of FIG. 3. This integrated circuit is provided on a thick film base 32 which is shown in the larger section of FIG. 3, inclosed by dot-dash lines. The terminals of the integrated circuit are shown within squares along the edge of dashes lines defining the integrated circuit. The terminals of the hybrid module are shown in the circles adajcent the dot-dash lines. Other components of the audio amplifier are shown below the heavy dashed lines.

Considering first the connections to the hybrid module 32, terminal 2 receives the audio signals applied to the audio amplifier, which are applied from the audio detector (18 in FIG. 2) to terminal 35. The sudio signal is applied from terminal 2 through coupling capacitor 36 and resistor 37 to the base of transistor 46 of the pre-amplifier section 45 of the audio amplifier. A direct current signal from the decoder (26 of FIG. 2) is applied to terminal 38, which is directly connected to terminal 4 of the hybrid module. The tone signal from the alert tone oscillator (28 of FIG. 2) is applied to terminal 40 of the audio amplifier and is coupled through resistor 41 to terminal 3 of the hybrid module.

Terminal 6 is provided on the hybrid module for application of a control voltage in certain applications, as will be explained. Other connections to the hybrid module are provided by terminals 7 and 9, which connect to the output circuit for the power amplifier, and terminal 8 which is a ground connection. Terminal 10 is provided for connection to the receiver squelch circuit (24 in FIG. 2), and terminals 11 and 12 provide for connection of a manual control to the control circuit for energizing the power amplifier. Timer capacitor 135 is connected between terminals 11 and 12 acts to deliberately delay squelch reset, as will be described. Terminal 13 provides a connection from the battery supply and terminal 14 provides for connection of the main filter capacitor for the internally switched power supply. Terminal 1 provides a connection for a power supply decoupling capacitor for the pre-amplifier section 45.

Considering now the amplifier in more detail, on the thick film there is provided a pre-amplifier 45 including transistors 46 and 48 which form a two stage transistor preamplifier. As previously stated, terminal 2 of the hybrid module is connected to the base of transistor 46 by capacitor 36 and resistor 37 for applying audio signals thereto. Terminal 38 is connected to the decoder (26 in FIG. 2) and provides a ground path for the base of transistor 46 so that this transsistor is operative. Amplified signals are applied from the collector of transistor 46 to the base of transistor 48 through capacitor 47. Resistor 43 connected in series with switch 44 between terminals 3 and 5 of the hybrid module, is selectively connected in parallel with the collector resistor 42 of transistor 46 to change the gain of pre-amplifier 45. By closing switch 44 which connects resistor 43 in parallel with resistor 42, the effective resistance is decreased so that a smaller voltage is applied to the base of transistor 48. Thus, a simple two level volume control is provided by action of switch 44, which replaces the usual more expensive variable resistor volume control.

The control voltage produced by the decoder in response to a call is applied to terminal 38 and is coupled through resistor 37 to the base of transistor 46. This control voltage, which is the supply voltage, biases the transistor 46 off so that the first stage of the pre-amplifier is inoperative. The alert tone signal applied to terminal 40 is coupled through resistor 41 to terminal 3, and through capacitor 47 to the base of transistor 48, so that the tone is amplified by the second stage of the pre-amplifier. The output of the pre-amplifier is applied from the collector of transistor 48 through capacitor 49 to terminal 104. This is terminal 4 of the integrated circuit, which forms the input to the power amplifier.

Considering now the power amplifier on the integrated circuit, this includes a differential amplifier input stage formed by transistors 50 and 51. The emitter electrodes of transistors 50 and 51 are connected together and to a constant current source controlled by transistor 55. Each of the differential input transistors is coupled to an amplifier section which includes two transistor stages in cascade. Transistor 50 is coupled to the amplifier section including transistors 58 and 59, with output transistor 59 being connected to output terminal 106 (terminal 6 on the integrated circuit chip) and terminal 7 of the hybrid module. Transistor 51 is coupled to the amplifier section including transistors 61 and 62, and output transistor 62 is connected to terminal 108 (terminal 8 on the integrated circuit chip) and terminal 9 of the hybrid module. These terminals are connected to an output device 60 which may be a center tapped loudspeaker, or a center tapper transformer which feeds a speaker. The battery potential is applied to the center tap of the output device, and the end terminals thereof are connected to the terminals 7 and 9 of the hybrid module.

Output transistors 59 and 62 are large geometry devices especially designed to have low saturation drops at peak load current, and each may have a drop on the order of 150 millivolts at a current of 100 milliamps. The transistors 59 and 62 are biased at near class B operation.

A DC negative feedback loop is provided for each side of the power amplifier, being provided for the side including transistor 50 by the transistor 64 having its base electrode connected to the collector electrode of transistor 58, and its collector electrode connected to the supply voltage by resistors 66 and 67. The common point between these resistors is connected to the base electrode of transistor 50 through resistors 68 and 70 to complete the feedback loop. Transistor 64, in addition to providing phase inversion in the negative feedback loop, serves as a voltage reference for the bias to the final stage 59. Transistor 64 has a base-emitter voltage drop closely matched to that of output transistor 59, so that bias to the ouptut class B stage, which is not in the feedback loop, is well stabilized by the feedback loop. The values of resistors 66 and 67 can be selected so that the circuit limits the output current at high signal levels.

On the other side of the amplifier, the transistor 72 is in the feedback loop from the collector of transistor 61 to the base of transistor 51. Transistor 72 has a base-emitter voltage drop closely matched to that of output transistor 62. The circuits of the two sides or sections of the amplifier are the same, and the circuit including transistor 72 operates in the manner described for the circuit including transistor 64.

As previously stated, transistor 55 forms a current source for the emitter electrodes of the input transistors 50 and 51. This provides the high alternative current impedance required, and also provides a DC voltage reference necessary for operation of the independent feedback loop of the above described differential amplifier. The voltage divider including resistors 76 and 77 connected between the supply voltage and the reference potential (ground) provides a reference voltage to transistor 78 which together with transistor 80 forms a differential amplifier. Transistor 81 couples the emitters of transistors 50 and 51 to the base of transistor 80, so that the differential amplifier compares the voltage at the emitters with the reference voltage and provides a compensating voltage. This compensating voltage is applied from the collector of transistor 78 to the base of transistor 55 to complete a direct current feedback loop. Capacitor 79, bypassing the circuit coupling the collector of transistor 78 to the base of transistor 55, eliminates the negative feedback for alternating current, so that transistor 55 forms a high impedance constant current source. The differential amplifier controls the current source transistor 55 to thereby control the DC reference voltage at its collector, and maintain a high AC impedance at the junction of the emitters of transistors 50 and 51.

The reference voltage at the collector of transistor 55 is applied through the emitter-collector junction of transistor 50 (and 51) to control the base voltage of transistor 58 (and 61). The conduction of transistor 58 controls the bias voltage applied to the base of transistors 64 and 59 (72 and 62), which have matched base-emitter drops. This controls the conductivity of transistor 64 (72) to establish the bias on the base of transistor 50 (51) to complete the feedback loop. The two differential amplifier loops are DC controlled relatively independently of each other by virtue of the voltage reference at the collector of transistor 55. This allows well balanced output currents in spite of nonsymmetrical circuit variations.

The audio amplifier, including both the pre-amplifier 45 on the thick film and the power amplifier of the integrated circuit ship 30, is energized by a voltage formed by the series regulator transistor 85 on the thick film, and a regulator reference circuit including transistors 88, 89, 90 and 91 on the integrated circuit chip. The battery supply from terminal 13 of the thick film is connected to the emitter electrode of transistor 85, and is supplied by conductor 86 connected to the collector electrode of this transistor to terminal 114 of the integrated circuit chip, and to the transistors of pre-amplifier 45. The voltage is regulated by control of the conduction of transistor 85, by the voltage applied to the base electrode thereof by the regulator circuit including transistors 88 to 91 inclusive, which provides a regulated voltage of 1.0 ± 0.050 volts from a one cell battery which has a normal voltage of the order of 1.2 volts, but which varies from 1.0 to 1.5 volts.

The voltage regulator is normally turned off by transistor 94, which is normally conductive. Transistor 94 when conducting grounds the base of transistor 88 to render regulator transistor 85 nonconducting. The conduction of transistor 94 is controlled by a control circuit including transistors 98, 100, 120, 121, 125, and 132, which is operated by voltages derived from the receiver and applied to terminals 6 and 10 of the hybrid module.

As previously stated, when a paging tone is received, a direct current voltage (very close to supply voltage) will be applied through terminal 38 to terminal 4 of the thick film. This is also applied through resistor 96 to terminal 6 of the thick film and to terminal 105 of the integrated circuit. The circuit continues through resistor 97 to the base electrode of transistor 98. As previously stated, this voltage turns off the first pre-amplifier transistor 46, and it turns on transistor 98 to ground the base of transistor 94 to turn off this transistor. This removes the ground from the base of the control transistor 88 of the regulator, so that the regulator operates to provide operating voltage for the amplifier. This operating voltage is applied through resistor 99 to the base of transistor 100, which is connected in parallel with transistor 98. Transistor 125 connects the base of transistor 100 to ground, but when transistor 125 is not conducting, the operating voltage for the amplifier applied through resistor 99 to transistor 100 renders this transistor conducting. Transistor 100 holds the base of transistor 94 grounded, thereby forming a latching circuit for holding the regulator transistor 86 conducting to supply the operating voltage.

As previously stated, the decoder turns on the alert tone oscillator (FIG. 2) which applies the tone signal to terminal 40. This tone is amplified by the second stage of the pre-amplifier including transistor 48. The output of the pre-amplifier is applied through terminal 104 to input transistor 50, and is amplified by the power amplifier and applied to the transducer 60. At the end of the alert tone, the voltage at terminal 38 drops to remove the turn off voltage to the pre-amplifier stage 46. The voice message applied at terminal 35 following the alert tone is, therefore, applied to the base electrode of transistor 46 and amplified by the pre-amplifier and applied to the power amplifier and to the transducer 60. The operating voltage remains on since the clamp stage 100 remains conducting to hold transistor 94 cut off.

For releasing the latch action of transistor 100, a circuit is provided operating from the receiver squelch voltage which is applied to terminal 10 of the hybrid module. When a carrier signal is received, a positive voltage (near the supply voltage) is applied to terminal 10, and this voltage is applied to terminal 109 of the integrated circuit. This turns on the series connected transistors 120 and 121 so that the voltage across there transistors is very small. This reduces the voltage applied by resistors 122*a*, 122*b*, 123 and 124 to the base electrode of transistor 125, to cut off this transistor. As transistor 125 is off, transistor 100 can be turned on by the operating potential applied to the base electrode thereof to provide the latching action. When the carrier signal terminates, the squelch voltage applied to terminal 10 of the hybrid module returns to a voltage near ground. This causes transistors 120 and 121 to turn off and turns on transistor 125, which grounds the base of transistor 100 and turns this transistor off, thereby releasing the latch. Transistor 94 is rendered conducting to cause the control signal to turn off transistor 86 to remove the operating potential. Capacitor 135 is connected to the base of transistor 125 and cooperates with resistors 122*a*, 122*b*, 123 and 124 to form a time delay circuit to hold the potential at this point. This prevents turn off of the amplifier if the squelch voltage is removed for a short time because of a temporary interruption of the signal. This time delay is controlled relatively independent of supply voltage variation by the circuit including transistor 121, the base of which is connected to the junction of resistors 122a and 122b in the collector circuit thereof.

A manual control for turning the amplifier on and off is provided including switch 128 connected through terminal 12 of the hybrid module to terminal 111 of the integrated circuit, and to the base of transistor 130. When switch 128 is closed, ground potential is applied to the base of transistor 130 to cut off this transistor. This applies a potential to the base of transistor 132 to turn on this transistor, to ground the base of transistor 94 so that the regulator operates to apply the operating voltage. It is pointed out that transistor 132 is in parallel with transistor 98 operated by the decoder control voltage, and with transistor 100 which is the latch transistor. Operation of switch 128, therefore, turns on the amplifier to thereby provide a monitoring operation. Release of the switch 128 causes the capacitor 135, which has been charged through switch 128, and through the circuit including resistors 122 and 123, to discharge to turn on transistor 125. As previously stated, turn on of transistor 125 releases the latch transistor 100. Accordingly, operation of the switch 128 turns on the amplifier and causes it to latch, and release of switch 128 releases the latch to turn off the amplifier.

The switch 128 can also be operated to turn on the amplifier and leave it on, by operating the switch 128 for a very short time. This will turn off transistor 130 and turn on transistor 132 to cause the regulator to operate, and the latch circuit will then hold the regulator operative. If switch 128 is operated for only a short time, capacitor 135 will not have time to charge substantially. Accordingly, there will not be a sufficient discharge of capacitor 135 to turn on transistor 125 to turn off the latch transistor 100.

The control circuit provided on the integrated circuit chip is flexible, so that the amplifier can be used in receivers having various different modes of operation. By leaving terminal 10 of the hybrid module unconnected, the latching action can be eliminated. In such case, the amplifier will be on only during the period of a DC control voltage is applied by the decoder to terminal 38 to hold transistor 98 on. During such operation, the user will hear the alert tone being reproduced, and can then operate switch 128 to energize the amplifier to receive a voice message.

The amplifier can also be used in a manner wherein the squelch voltage holds the amplifier energized. In such cases, the squelch circuit (24 in FIG. 2) is connected to terminal 6 of the hybrid module, which is connected to terminal 105 of the integrated circuit to apply the squelch voltage to the base of transistor 98. Resistor 96 must be eliminated for such squelch operation to prevent turning off the first preamplifier stage. The squelch voltage will therefore hold the audio amplifier operative as long as a signal is received.

The amplifier described has been found to provide stable high gain action, when operating from a low battery voltage, which may vary over the range from 1.0 to 1.5 volts. The regulator provides a substantially constant voltage to the amplifier, and removes the operating voltage when the amplifier is not being used to conserve the battery energy. The amplifier described can provide an audio output of as much as 100 milliwatts, which is adequate for a personal radio or paging receiver.

I claim:

1. A low voltage integrated circuit audio amplifier including in combination, an input stage including first and second emitter coupled transistors each having a base electrode forming an input and a collector electrode forming an output, first and second transistor amplifier sections independent of each other and having inputs connected to said collector electrodes of said first and second transistors respectively, each of said transistor amplifier sections including first and second common emitter connected transistors, said first transistor of each amplifier section having a base electrode direct current coupled to said collector electrode of the associated transistor of said input stage, and said second transistor of each amplifier section having a base electrode direct current coupled to the collector electrode of said first transistor thereof, said transistors of said input stage and said transistors of said amplifier sections all being of the same conductivity type, a direct current feedback circuit connected from each amplifier section to said base electrode of the associated transistor of said input stage, means forming a current source connected to said emitter electrodes of said first and second transistors of said input stage, and load circuit means connected to the collector electrode of said second transistor of each amplifier section.

2. An audio amplifier in accordance with claim 1 including voltage regulator means coupled to said input stage and to said amplifier sections for providing operating voltages therefor, and control circuit means coupled to said voltage regulator means for controlling the operation thereof.

3. An audio amplifier in accordance with claim 1 wherein said feedback circuit for each transistor amplifier section is connected from said collector electrode of said first transistor of said section and includes an inverter transistor.

4. An audio amplifier in accordance with claim 3 wherein said inverter transistor forms a voltage reference to stabilize the bias for said second transistor of said transistor amplifier section.

5. An audio amplifier in accordance with claim 3 wherein said inverter transistor for each transistor amplifier section has base, emitter and collector electrodes, with said base electrode connected to said collector electrode of said first transistor of such amplifier section, said emitter electrode connected to a reference potential and said collector electrode coupled to the input of the associated transistor of said input stage.

6. An audio amplifier in accordance with claim 5 wherein said inverter transistor for each transistor amplifier section and said second transistor thereof have matched base-emitter voltage drops.

7. An audio amplifier in accordance with claim 1 wherein said means forming a current cource includes a constant current transistor having a base electrode and collector and emitter electrodes forming a current path between the emitter electrodes of said first and second transistors of said input stage and a reference potential, and reference voltage means connected to said base electrode for controlling said constant current transistor whereby a reference voltage is provided at said collector electrode thereof for stabilizing the operation of said first and second transistors.

8. An audio amplifier in accordance with claim 7 wherein said reference voltage means connected to said base electrode of said constant current transistor includes a further transistor having base and emitter electrodes, and a voltage divider providing a reference voltage connected to said base electrode of said further transistor.

9. An audio amplifier in accordance with claim 8 further including a feedback circuit connecting the collector electrode of said constant current transistor to the emitter electrode of said further transistor.

10. A low voltage audio amplifier formed as a hybrid thick film module with an integrated circuit, and including in combination, a pre-amplifier section on the thick film having an output an integrated circuit amplifier section having an input connected to said output, said integrated circuit amplifier section including an input stage having first and second emitter coupled transistors, and first and second amplifier portions which are independent of each other connected to said first and second transistors, respectively, voltage regulator means for providing operating potentials to said amplifier sections, said voltage regulator means including a series regulating transistor on the thick film connected to said amplifier sections and control means on the integrated circuit for said regulating transistor, and control circuit means on the integrated circuit coupled to said control means and rendered operative by a control signal for controlling the operation of said voltage regulator means to cause energization of said amplifier section in response to the control signal.

11. An audio amplifier in accordance with claim 10 wherein said control circuit means includes a transistor switching circuit for enabling said voltage regulator means in response to a control potential.

12. An audio amplifier in accordance with claim 11 wherein said transistor switching circuit includes a plurality of parallel connected transistors for enabling said voltage regulator means, with manual control means connected to one of said transistors, and circuit means connected to another one of said transistors for automatic operation.

13. An audio amplifier in accordance with claim 11 wherein said transistor switching circuit includes a transistor connected to provide a latch for holding the voltage regulator operative.

14. An audio amplifier in accordance with claim 13 further including control means connected to said latch transistor for releasing the same at the termination of a communication.

* * * * *